United States Patent [19]
Buchanan et al.

[11] Patent Number: 5,789,312
[45] Date of Patent: Aug. 4, 1998

[54] METHOD OF FABRICATING MID-GAP METAL GATES COMPATIBLE WITH ULTRA-THIN DIELECTRICS

[75] Inventors: Douglas Andrew Buchanan, Cortland Manor; Fenton Read McFeely, Ossining, both of N.Y.; John Jacob Yurkas, Stamford, Conn.

[73] Assignee: International Business Machines Corporation, Armonk, N.Y.

[21] Appl. No.: 739,765

[22] Filed: Oct. 30, 1996

[51] Int. Cl.[6] ............................................. H01L 21/3205
[52] U.S. Cl. ............................................................. 438/585
[58] Field of Search ........................... 437/40 GS, 41 GS, 437/187; 438/585, 586

[56] References Cited

U.S. PATENT DOCUMENTS

| | | | |
|---|---|---|---|
| 4,392,299 | 7/1983 | Shaw | 437/200 |
| 4,505,028 | 3/1985 | Kobayashi et al. | 437/187 |
| 4,817,557 | 4/1989 | Diem et al. | 118/719 |
| 5,212,400 | 5/1993 | Joshi | . |
| 5,407,852 | 4/1995 | Ghio et al. | 437/48 |
| 5,539,230 | 7/1996 | Cronin | 257/306 |
| 5,565,247 | 10/1996 | Suzuki | 427/562 |

OTHER PUBLICATIONS

Davari, B. "Submicron Tungsten Gate Mosfet with 10 nm Gate Oxide", *1987, VLSI Symposium*, Japan.

Noda, Hiromasa, "Tungsten Gate Technology for Quarter-Micron Application", *Jpn. J. Appl. Phys.* vol. 35, (1996), pp. 807–811.

*Primary Examiner*—Brian Dutton
*Attorney, Agent, or Firm*—Scully, Scott, Murphy & Presser

[57] ABSTRACT

A method of fabricating a mid-gap workfunction tungsten gate or W electrode directly onto a gate dielectric material for use in high speed/high density advanced MOS and CMOS devices is provided which utilizes low temperature/low pressure CVD of a tungsten carbonyl. MOS and CMOS devices containing one or more of the CVD W gates or W electrodes manufactured by the present invention are also provided herein.

22 Claims, 6 Drawing Sheets

METHOD OF FABRICATING MID-GAP METAL GATES COMPATIBLE WITH ULTRA-THIN DIELECTRICS

TECHNICAL FIELD

The present invention relates to a method for fabricating mid-gap workfunction tungsten (W) gates directly onto gate dielectric materials such as ultra-thin gate dielectric materials for use in high speed/high density advanced metal oxide semiconductor (MOS) and complementary metal oxide semiconductor (CMOS) devices. Specifically, the mid-gap workfunction W gates of the instant invention are fabricated directly onto gate dielectric materials by employing a low temperature/low pressure chemical vapor deposition (CVD) technique using tungsten hexacarbonyl, $W(CO)_6$, as the source material. The method of the present invention can also be used in fabricating W electrodes which may be employed in quantum devices.

The present invention also relates to high speed/high density advanced MOS and CMOS devices such as field effect transistors (FETs) and simple capacitors which contain at least one mid-gap workfunction W gate on a gate dielectric material, wherein said mid-gap workfunction W gate is fabricated by the method of the present invention.

PRIOR ART

In the field of advanced semiconductor manufacturing, high speed/high density MOS devices require extremely short channel lengths which are typically less than 0.1 µm. Straight scaling of existing MOS device structures to these short channel lengths is not practicable nor is it feasible.

Accordingly, several new types of MOS devices, e.g. silicon-on-insulators (SOIs) and double gate MOS devices, containing polysilicon gates have been developed to overcome the foregoing problem with prior art MOS devices. Common to all of these prior art devices, however, is the need for extremely thin gate dielectric materials which generally have a thickness of less than about 4.0 nm. A device with such a thin gate dielectric material must be operated with as low a bias voltage as possible.

In current practice, the threshold voltage, $V_T$, is controlled by the adjustment of two parameters. First, the workfunction of the polysilicon gate is adjusted by doping the gate $p^+$ or $n^+$ for p-FETs and n-FETs, respectively. Second, the workfunction of the channel is adjusted by appropriately doping of the substrate to provide an acceptable workfunction difference between the channel and the gate. This workfunction difference provides a built-in potential, which, operating in conjunction with the externally applied bias, turns the device on and off.

For MOS devices far below 0.1 µm gate lengths, fluctuations in local dopant concentrations from one device to another results in an unacceptable large spread in $V_T$. Advanced CMOS designs must therefore be fabricated with essentially intrinsic channels. This removes one of the parameters heretofore used to set $V_T$ only the gate workfunction remains.

In order to have the smallest possible externally applied bias voltage, the Fermi level of the gate should lie midway between the valence and conduction bands of silicon; i.e. at mid-gap. The existing technology, which consequently employs polysilicon gates, cannot satisfy this requirement. Thus, there is a need for developing a new gate material having a mid-gap workfunction, a good conductivity as well as being compatible with the processing of delicate ultra-thin dielectrics. This includes, but not limited to, an absence of energetic charged particles, ionizing radiation, corrosive reagents which may attack the ultra-thin gate dielectric material and any undesirable thermodynamically inherent interactions between the gate material and the dielectric, e.g. inter-diffusion, surface roughening or mutual chemical instability. It is noted that these latter inherent requirements are extremely stringent for ultra-thin dielectrics because unacceptable large leakage currents may be induced by very small absolute changes in the effective thickness of the dielectric.

These and other objectives are met by the present method which provides a mid-gap workfunction W gate or electrode that is deposited directly on a dielectric layer such as an ultra-thin dielectric material using a low temperature/low pressure CVD process with tungsten hexacarbonyl, $W(CO)_6$, as the source material.

It is emphasized that the deposition of W using CVD techniques is well known in the art and it is generally applied as a wiring means in packaging applications. In those applications, tungsten hexafluoride, $WF_6$, is typically used as the source material not $W(CO)_6$. Little attention has been given to the use of tungsten carbonyls in wiring applications since relatively high temperatures are necessary to produce reasonably pure W films.

Mid-gap workfunction W gates using $WF_6$ CVD chemistry have been previously disclosed in the prior art. This process, however, differs fundamentally from the present invention, in that $WF_6$ cannot be used to deposit W directly onto ultra-thin gate dielectric materials. Instead, thick layers of silicon must first be deposited onto the gate dielectric material in a chemical activation step, and then the silicon is reacted away (to form $SiF_4$) leaving W in its stead. Moreover, it has been determined that exposure of even quite thick oxide films (250 nm) to $WF_6$ causes, without any exceptions, complete device failure owning to massive gate dielectric leakage currents. Other techniques besides CVD have been employed, however, none of the prior art processes are capable of depositing W directly onto ultra-thin gate dielectric materials.

Despite the potential use of tungsten carbonyls in wiring applications there is no disclosure of using $W(CO)_6$ as the CVD source material for providing mid-gap workfunction W gates on dielectric materials such as ultra-thin gate dielectric materials.

SUMMARY OF THE INVENTION

One object of the present invention is to provide a method for fabricating mid-gap workfunction W gates directly onto gate dielectric materials such as ultra-thin gate dielectric materials for use in MOS and CMOS applications without the need of any preparatory chemical activation steps such as is generally required by most prior art processes.

Another object of the present invention is to provide a method of fabricating mid-gap workfunction W gates which are compatible with gate dielectric materials such as ultra-thin gate dielectric materials; have a highly purity (greater than 99.99%) and a resistivity value close to the ideal bulk value which is about 5 to about 6 µohm-cm.

Another object of the instant invention is to provide a method for fabricating W electrodes directly onto dielectric electric materials which comprises low temperature/low pressure CVD process using $W(CO)_6$ as a source material.

A further object of the present invention relates to MOS and CMOS devices such as FETs which contain at least one W gate of the present invention deposited directly onto a gate dielectric material by CVD using $W(CO)_6$ as the source material.

These as well as other objects are achieved by the present invention by using a low temperature/low pressure CVD technique with W (CO)$_6$ as the source material. Specifically, the method of the present invention comprises the steps of: (a) depositing a uniform layer of W directly onto a dielectric material such as an ultra-thin gate dielectric material, said dielectric material being positioned on a semiconductor substrate, said deposition is carried out by CVD using W (CO)$_6$ as the source material under conditions which are sufficient to form said W layer; and (b) patterning the structure formed in step (a) using standard lithographic techniques to form a MOS device containing said mid-gap workfunction W gate on said dielectric material. It is emphasized that no chemical activation step is required in the present invention to deposit the W layer onto the dielectric material.

The present invention also provides MOS devices such as FETs which comprise at least one mid-gap workfunction W gate prepared in accordance with the method of the present invention. The devices of the present invention exhibit gate leakage comparable to prior devices prepared in accordance with existing technology and they exhibit the theoretical value for metal-gate workfunction.

The present invention further provides a method of fabricating W electrodes for use in quantum devices. In accordance with this embodiment of the present invention, the W electrode is fabricating by a method which comprises the steps of: (a) depositing a layer of W onto a dielectric material, wherein said deposition is carried out by chemical vapor deposition (CVD) using W(CO$_6$) as a source material; and (b) patterning said W layer to form said W electrode on said dielectric material.

DETAILED DESCRIPTION OF THE INVENTION

As stated above, the present invention provides a method of fabricating mid-gap workfunction W gates or W electrodes directly onto dielectric materials which are present on MOS devices without the need of any chemical activation steps. The mid-gap workfunction W gates and W electrodes produced in accordance with the present method are highly pure, compatible with ultra-thin gate dielectric materials found on MOS devices and have resistivity values close to the ideal bulk value.

In accordance with the method of the present invention, a layer of W is directly deposited on the surface of a dielectric material which is on top of a semiconductor substrate by employing CVD using W(CO)$_6$ as the source material under conditions which are sufficient to form said W layer on the dielectric material. That structure containing the W layer is then patterned using conventional techniques well known to those skilled in the art.

Figure 1:
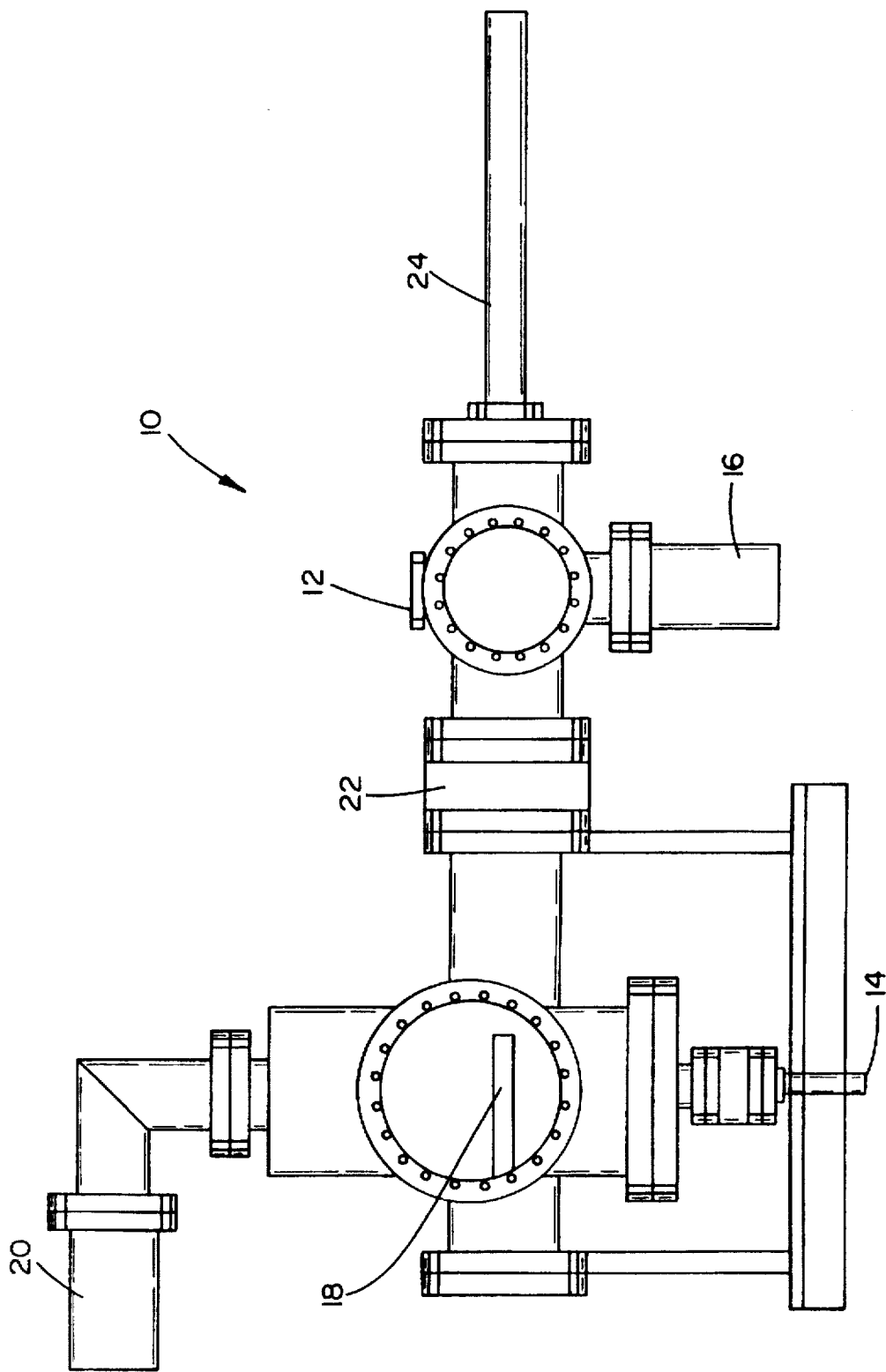
FIG. 1 is a schmetic diagram of a prior art CVD apparatus which can be used in the present invention to deposited W directly onto an ultra-thin gate dielectric material.

Reference is made to FIG. 1 which shows a CVD apparatus 10 that can be employed in the present invention to deposit the W layer. Specifically, apparatus 10 includes a load-lock stainless steel reactor 12 which comprises a graphite sample holder cartridge, not shown in FIG. 1, wherein the test MOS wafer is placed. The reactor 12 further includes a heater assembly 18 for heating the sample during deposition and two ultra-high vacuums 20 and 16 for controlling the pressure during the deposition.

The source material 14, tungsten hexacarbonyl, W(CO)$_6$, is introduced into reactor chamber 12 via a stainless steel valve 22 and is directed to a test MOS wafer which is contained within reactor 12 by tube 24.

Any grade of W(CO)$_6$ can be used in the present invention. If a low purity W(CO)$_6$ grade is used, it can be purified prior to being introduced into reactor chamber 12 using purification techniques well known to those skilled in the art.

CVD of W(CO)$_6$ occurs at a temperature of from about 250° C. to about 600° C. More preferably, the CVD deposition of W occurs at a temperature of from about 275° C. to about 500° C. The pressure of the reactor during CVD is from about $1 \times 10^{-6}$ Torr to about $3 \times 10^{-4}$ Torr. More preferably, the CVD of W(CO)$_6$ occurs at a pressure of from about $1 \times 10^{-4}$ Torr to about $2 \times 10^{-4}$ Torr.

The CVD process is carried out for a time period of from about 3 minutes to about 4 hrs. Longer and shorter deposition times than these specified above are also contemplated herein.

It is noted that under the above conditions a layer of W having a thickness of from about 3.5 to about 200, more preferably from about 50 to about 100, nm is deposited directly onto the dielectric material.

Figure 2A:
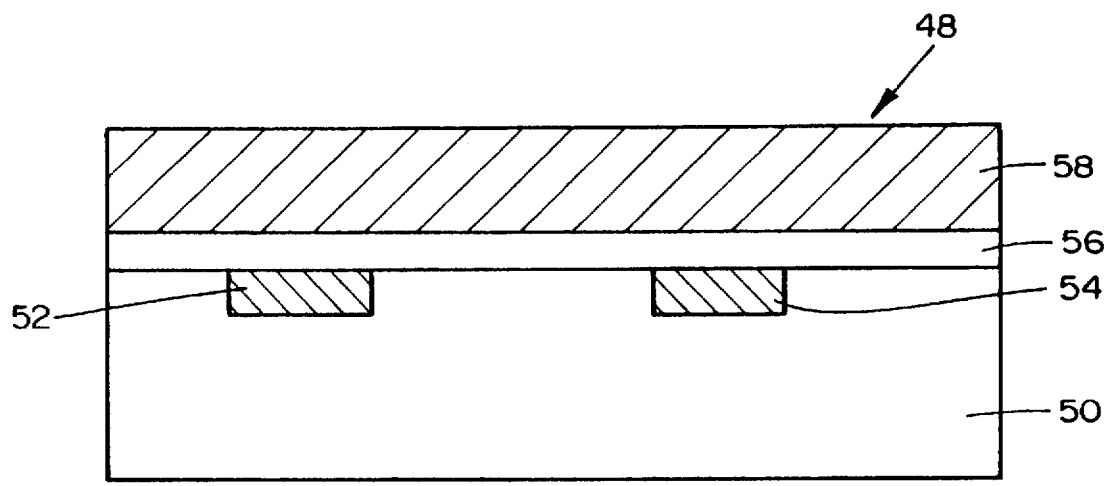
FIGS. 2A and 2B are cross-sectional views of a typical MOS device prepared in accordance with the method of the present invention: (A) after W deposition, and (B) after patterning.

A MOS wafer which can be employed in the present invention is shown in FIG. 2A. Specifically, the MOS wafer 48 that may be employed in the present invention comprises a semiconductor substrate 50 having at least one drain region 52 and at least one source region 54 embedded therein. The drain and source regions may also be located on top of the semiconductor substrate. On top of semiconductor substrate 50 is a layer of a dielectric material 56. A layer of W 58 is formed onto the upper surface of gate dielectric layer 56 by the CVD technique described hereinabove.

The semiconductor substrates 50 that may be employed in the present include, but are not limited to, silicon, SiGe or GaAs. Of these semiconductor substrates, silicon is most highly preferred.

The semiconductor substrates employed in the present invention can be of the p-type or the n-type depending upon the desired MOS device being manufactured. The substrates can be manufactured using techniques well known to those skilled in the art. The thickness of the semiconductor substrate is not critical to the method of the present invention and thus it may vary from one thickness to another depending upon the desired device being fabricated.

The ultra-thin dielectrics materials employed in the present invention include, but are not limited to, $SiO_2$, nitrided $SiO_2$, $Si_3N_4$, metal oxides and mixtures or combinations thereof. The dielectrics employed in the present invention may be grown, deposited or reacted by using techniques well known to those skilled in the art. Of the gate dielectric materials mentioned hereinabove, $SiO_2$ or lightly nitrided $SiO_2$ (5% or less total nitride content) is highly preferred at present.

In another highly preferred embodiment of the present invention, ultra thin gate dielectric materials are employed. The term "ultra-thin" as used herein denotes a gate dielectric material as defined above which has a total thickness such that when it is incorporated into a device and operated under normal conditions the bulk of its gate leakage current is a result of direct tunneling. Specifically, for $SiO_2$ this corresponds to a thickness of less than about 4.0 nm. More specifically, the term "ultra-thin" denotes a gate dielectric material which has a thickness of less than about 3.0 nm.

Figure 2B:
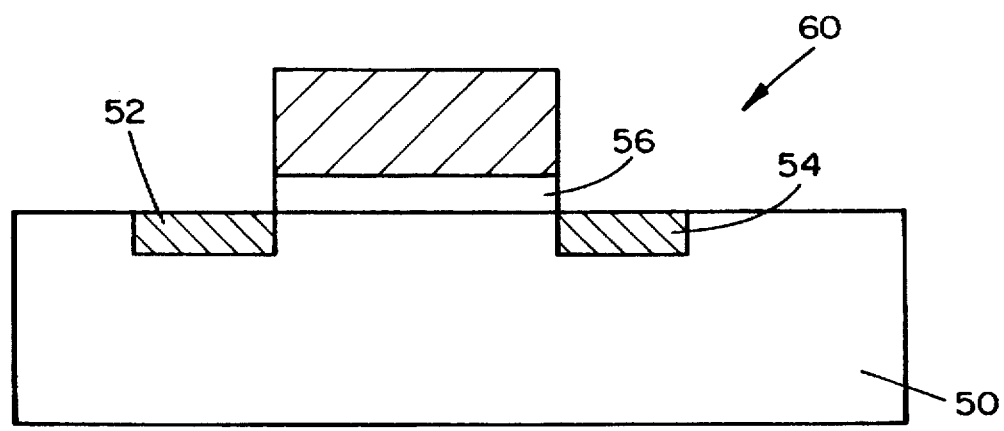

After depositing W layer 58, the MOS wafer shown in FIG. 2A is patterned using standard lithographic techniques well known to those skilled in this art. This includes, but not limited to, positioning photoresists on the surface of the CVD W layer; developing the photoresists and removing, via etching techniques, those areas that do not contain the photoresists. The final structure 60 formed after patterning is shown in FIG. 2B.

Etching may be carried out using wet or dry techniques well known to those skilled in the art. When wet etching is employed, the chemical etchant is selected from the group consisting of $H_2O_2$, chromic acid, phosphoric acid, acetic acid, and the like thereof. The preferred chemical etchant employed in the present invention is $H_2O_2$. Mixtures of the chemical etchants alone or with water are also contemplated herein..

When dry chemical etching is employed in the present invention, it may be carried out by reactive ion etching (RIE), ion beam etching (IBE) or laser ablation. Each of the aforementioned dry etching techniques are well known to those skilled in the art.

The present invention also relates to MOS devices which contain at least one mid-gap workfunction W gate on an ultra-thin gate dielectric material fabricated by the method of the present invention in its structure. A simplified MOS device containing one mid-gap W gate prepared in accordance with the method of the present invention is shown in FIG. 2B. Devices contain two or more W gates, such as dual gate MOS devices, are also contemplated herein.

Other MOS devices such as field effect transistors (FETs), simple capacitor structures, field emission devices and quantum devices are also contemplated herein. Common to all those structures is that they contain at least one mid-gap workfunction W gate or W electrode which is fabricated in accordance with the method of the present invention directly onto a dielectric material.

The following example is given to illustrate the scope of the present invention. Because this example is given for illustrative purposes only, the invention embodied therein should not be limited thereto.

EXAMPLE 1

Test structures were fabricated using thermally grown silicon dioxide thin films ranging in thickness from 2.8–7.0 nm to form MOS capacitors. Individual capacitors were isolated using a 100 nm thermally grown field oxide. Films were grown on both p-type and n-type wafers with resistivities of about 0.1 to 0.2 ohm-cm.

Tungsten films were deposited on the test wafers in blanket fashion. Specifically, W deposition was carried out in a load-locked, stainless steel reactor with a base pressure of about $10^{-9}$ torr. Tungsten hexacarbonyl, $W(CO)_6$, was used as the source gas and it was emitted into the reactor via a stainless steel valve and directed onto the sample via a copper tube. The samples were introduced on a graphite sample holder cartridge which in turn was introduced into a heater assembly located within the reactor chamber. The deposition was conducted at a temperature of about 500° C. The growth rate in the system was about 1.5 nm/minute and was roughly temperature independent, indicative of a transport limited growth regime.

After deposition of the W films, devices were patterned using standard lithographic techniques. The tungsten film on each device was wet-etched using $H_2O_2$. Capacitor structures were thus formed with areas ranging from about $10^{-6}$ to about $10^{-2}$ $cm^2$.

Figure 3:
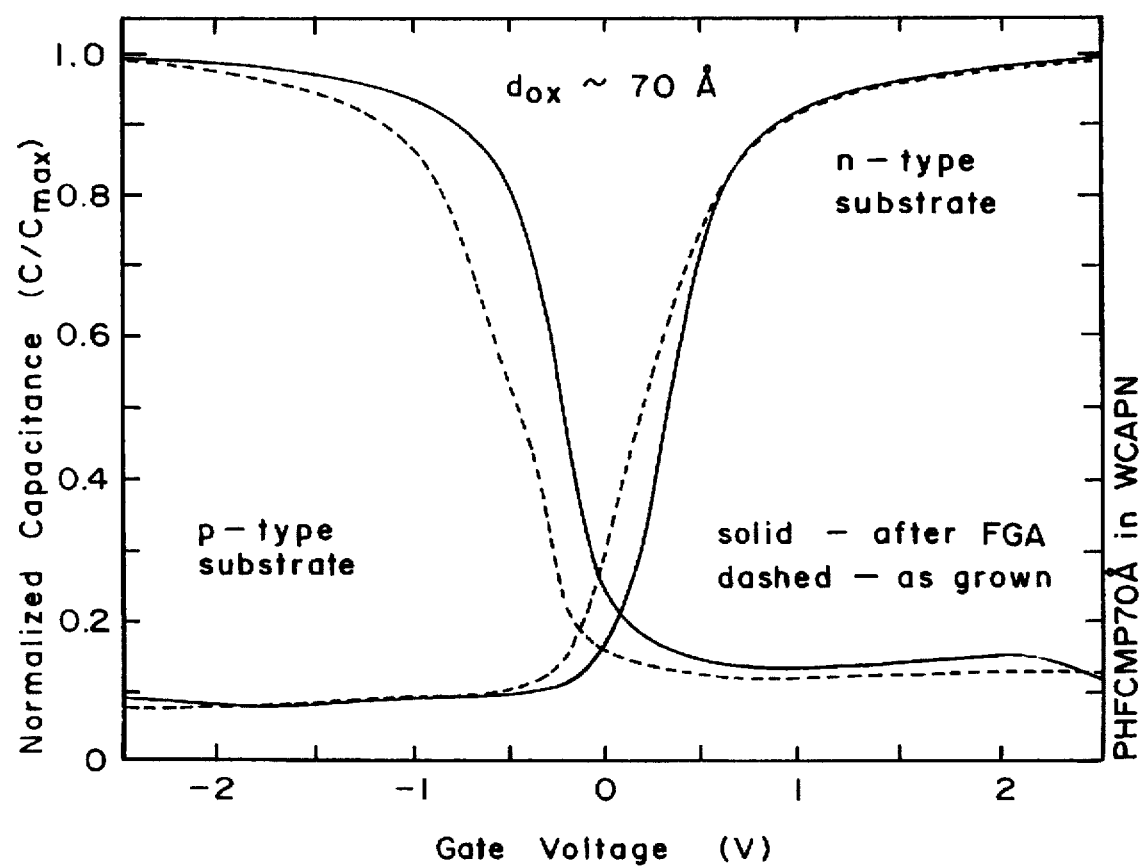
FIG. 3 is a capacitance-voltage diagram for a W gate capacitor structure formed in accordance with the present invention having a thickness of 3.0 nm. Dotted line "---" as grown; solid line "-" after forming gas anneal (FGA).
Figure 4:
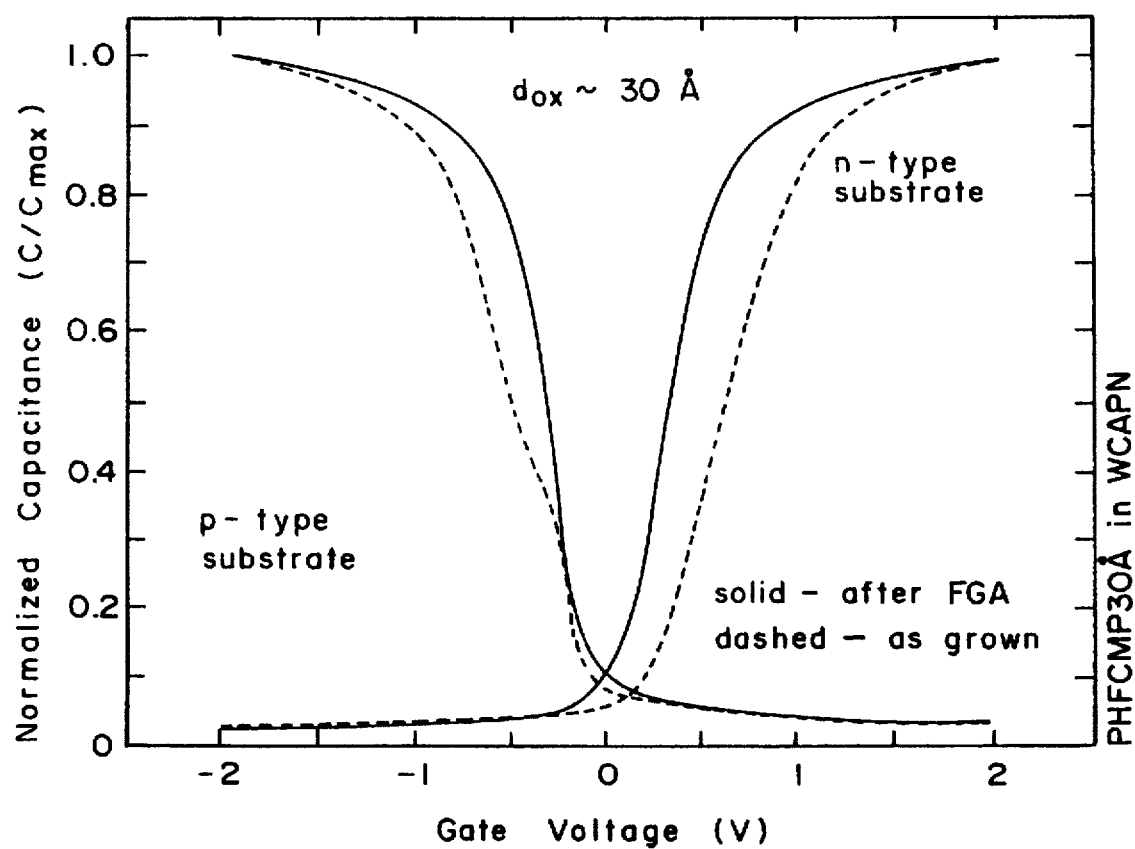
FIG. 4 is a capacitance-voltage diagram for a W gate capacitor structure formed in accordance with the present invention having a thickness of 7.0 nm. Dotted line "----" as grown; solid line "-" after FGA.
Figure 5:
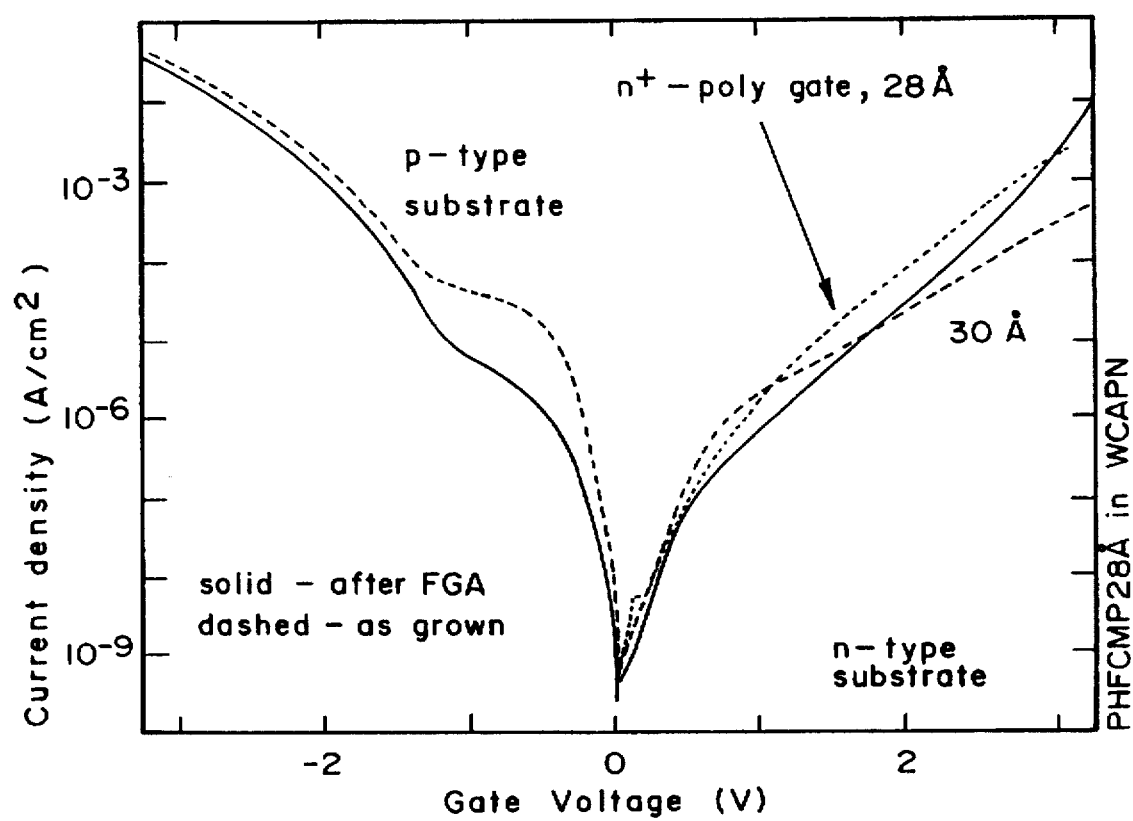
FIG. 5 is a current-voltage diagram for a W gate capacitor structure formed in accordance with the present invention having a thickness of 3.0 nm. Dotted line "---" as grown; solid line "-" after FGA.
Figure 6:
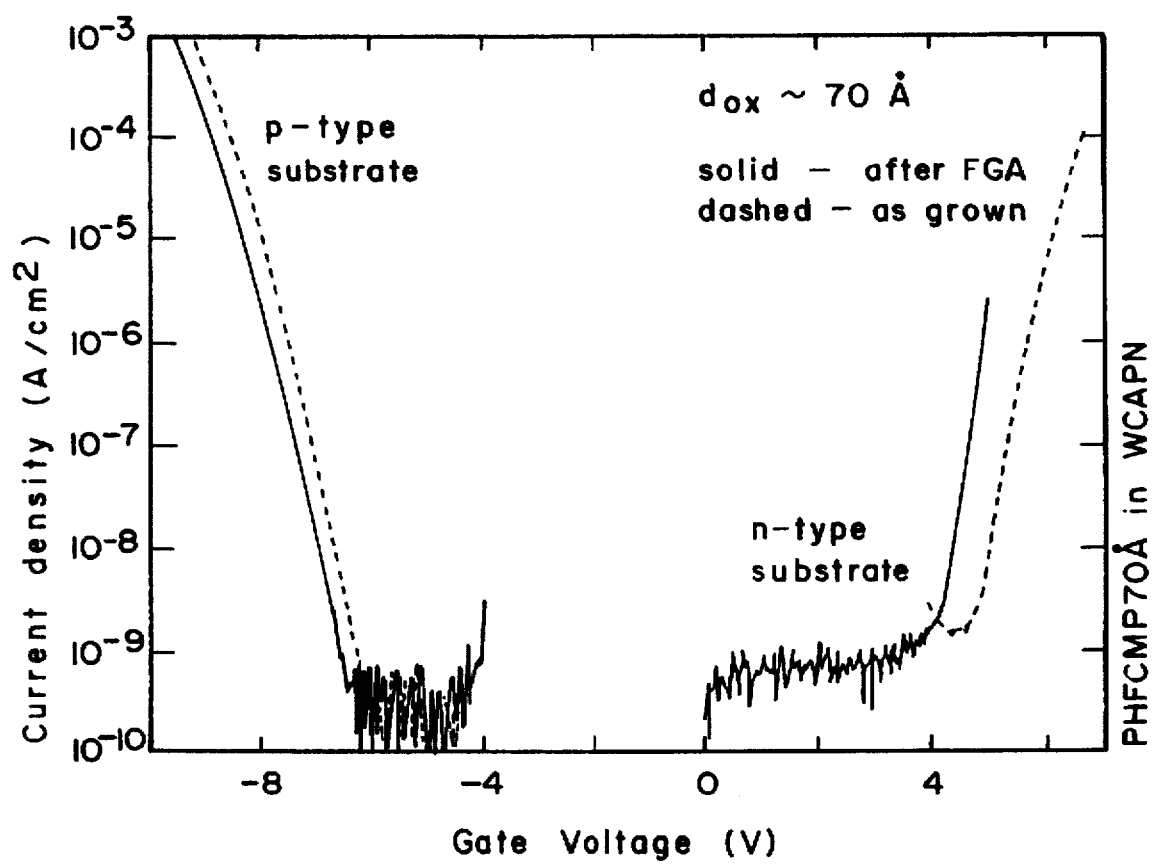
FIG. 6 is a current-voltage diagram for a W gate capacitor structure formed in accordance with the present invention having a thickness of 7.0 nm. Dotted line "---" as grown; solid line "-" after FGA.

The capacitor prepared above were tested using high frequency and quasi-static capacitance-voltage (C-V) and current-voltage techniques. FIGS. 3 and 4 show C-V data for W gate capacitors structures formed with W gate oxides having a thickness of about 3.0 and 7.0 nm capacitor. Data is shown for devices containing both p-type and n-type silicon wafers. The dotted and solid lines show the C-V data before and after a standard post metal gate deposition forming gas anneal (FGA) step which is carried out in 10% $H_2$ in nitrogen at 450° C. for about 30 minutes. FIGS. 5 and 6 show the C-V characteristics for the as processed and FGA structures, respectively.

Analysis of the C-V data show interface state densities in the low $10^{11}$ $cm^{-2}$ $ev^{-1}$ for samples subjected to FGA. The flat band voltage is approximately 0.3 and −0.3 Volts for n-type and p-type substrates, respectively. This, in itself, demonstrate that the Fermi-level of the metal gate is situated very close to silicon mid-gap. This is also demonstrated by the symmetry of the C-V curves about the y-axis in FIGS. 3 and 4. Since the substrates are of approximately the same doping concentration for both the n-type and p-type substrates, one would expect a mid-gap metal workfunction gate to show complete symmetry about the voltage axis.

Current-voltage data from the aforementioned capacitors structures, as shown in FIGS. 5 and 6, show leakage currents which are consistent with the relative Fermi-level of the tungsten gate and the silicon substrate.

These data demonstrate that the tungsten gate capacitors have leakage currents as low as those exhibited by standard polysilicon based capacitors as shown in FIG. 5. (In order to make a valid comparison, leakage currents were compared as a function of the true gate dielectric voltage drop, $V_{ox}=V_{gate}-V_{FB}$). Note that this result was obtained for not only for the thick, 7.0 nm gate dielectric, but also for the ultra-thin 3.0 nm dielectric film. Previous attempts by other workers to make tungsten gates (by other techniques) were not able to achieve this requirement even for films in the 7.0 nm thick regime.

While this invention has been particularly shown and described with respect to preferred embodiments thereof, it will be understood by those skilled in the art that the foregoing and other changes in form and details may be made therein without departing from the spirit and scope of the invention.

Having thus described our invention, what we claim as new, and desire to secure by letters patent is:

1. A method of fabricating a mid-gap workfunction tungsten (W) gate for use in metal oxide semiconductor (MOS) applications, said method comprises (a) depositing a layer of W onto a gate dielectric material, said gate dielectric material being positioned on a semiconductor substrate, wherein said depositing step is carried out by chemical vapor deposition (CVD) using $W(CO)_6$ as a source material; and (b) patterning the structure formed in step (a) using lithographic techniques to form a MOS device containing said mid-gap workfunction W gate on said gate dielectric material.

2. The method of claim 1 wherein said gate dielectric material is an ultra-thin gate dielectric material having a thickness of less than about 4.0 nm.

3. The method of claim 2 wherein said ultra-thin gate dielectric material has a thickness of less than about 3 nm.

4. The method of claim 3 wherein said ultra-thin gate dielectric material is selected from the group consisting of $SiO_2$, nitrided $SiO_2$, $Si_3N_4$, metal oxides and mixtures thereof.

5. The method of claim 4 wherein said ultra-thin gate dielectric material is $SiO_2$.

6. The method of claim 1 wherein said semiconductor substrate contains at least one source and at least one drain region.

7. The method of claim 6 wherein said semiconductor substrate is of the p-type or of the n-type.

8. The method of claim 7 wherein said semiconductor substrate is a substrate composed of silicon, SiGe or GaAs.

9. The method of claim 8 wherein said semiconductor substrate is composed of silicon.

10. The method of claim 1 wherein said CVD is carried out at a temperature of from about 250° C. to about 500° C.

11. The method of claim 10 wherein said CVD is carried out at a temperature of from about 275° C. to about 600° C.

12. The method of claim 1 wherein said CVD is carried out at a pressure of about $1 \times 10^{-6}$ Torr to about $3 \times 10^{-4}$ Torr.

13. The method of claim 12 wherein said CVD is carried out at a pressure of about $1 \times 10^{-4}$ Torr to about $2 \times 10^{-4}$ Torr.

14. The method of claim 1 wherein said CVD results in said W layer having a thickness of from about 3.5 nm to about 200 nm.

15. The method of claim 14 wherein said W thickness is from about 50 nm to about 100 nm.

16. The method of claim 1 wherein said patterning step comprises positioning at least one photoresist on an area of said W layer; developing said photoresist; and etching areas of said W layer not containing said photoresist.

17. The method of claim 16 wherein said etching step comprises wet etching or dry etching.

18. The method of claim 17 wherein said wet etching is conducted using a chemical etchant selected from the group consisting of $H_2O_2$, phosphoric acid, chromic acid, nitric acid, and mixtures thereof.

19. The method of claim 18 wherein said chemical etchant is $H_2O_2$.

20. The method of claim 17 wherein said dry etching includes Reactive Ion Etching (RIE), Ion Beaming Etching (IBE) and Laser Ablation.

21. The method of claim 1 wherein said semiconductor substrate is a p-type or n-type semiconductor substrate of a MOS wafer, said MOS wafer having at least one source and drain region therein.

22. A method of fabricating a tungsten (W) electrode comprising the steps of:

(a) depositing a layer of W onto a dielectric material, wherein said depositing comprises chemical vapor deposition using $W(CO)_6$ as a source material; and (b) patterning said W layer to form said W electrode on said dielectric material.

* * * * *